(12) United States Patent
Dang et al.

(10) Patent No.: US 10,371,729 B2
(45) Date of Patent: Aug. 6, 2019

(54) REAL-TIME ESTIMATION OF SOLAR IRRADIATION

(71) Applicant: International Business Machines Corporation, Armonk, NY (US)

(72) Inventors: Hien P. Dang, Nanuet, NY (US); Sri M. Sri-Jayantha, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 254 days.

(21) Appl. No.: 15/003,202

(22) Filed: Jan. 21, 2016

(65) Prior Publication Data

US 2017/0212156 A1   Jul. 27, 2017

(51) Int. Cl.
G01R 21/00      (2006.01)
G01R 21/133    (2006.01)
G01J 1/42         (2006.01)

(52) U.S. Cl.
CPC ............... *G01R 21/133* (2013.01); *G01J 1/42* (2013.01); *G01J 2001/4266* (2013.01); *G01J 2001/4276* (2013.01)

(58) Field of Classification Search
CPC .... G01J 1/42; G01J 2001/4276; G01R 21/133
USPC .............................................. 702/60, 3, 18, 6
See application file for complete search history.

(56) References Cited

U.S. PATENT DOCUMENTS

| | | |
|---|---|---|
| 8,396,694 B2 | 3/2013 | Le Pivert |
| 8,600,572 B2 | 12/2013 | Sri-Jayantha |
| 2013/0090770 A1 | 4/2013 | Lee et al. |
| 2013/0166266 A1* | 6/2013 | Herzig ............... G01W 1/10 703/6 |
| 2014/0136178 A1* | 5/2014 | Meagher ............. G06F 17/5009 703/18 |
| 2014/0149038 A1* | 5/2014 | Cronin ................... G01W 1/10 702/3 |
| 2014/0306525 A1 | 10/2014 | Greer et al. |

(Continued)

OTHER PUBLICATIONS

A. Gelb, et al., "Applied Optimal Estimation," The MIT Press, The Analytical Sciences Corporation, Sep. 1980, p. 1-2.

(Continued)

*Primary Examiner* — Connie C Yoha
(74) *Attorney, Agent, or Firm* — Cantor Colburn LLP; Vazken Alexanian

(57) ABSTRACT

Aspects relate to methods, systems, and computer program products for estimating future levels of solar power received at a sensor including receiving, by a processor, a first measured power value at a first time from the sensor, calculating a first value of a dynamic correction factor based on the first measured power value associated with the first time, applying the first value of the calculated dynamic correction factor to a power estimation model, generating a first power estimation value for a second time using the power estimation model, wherein the second time is later than the first time, receiving a second measured power value at the second time, and calculating a second value of a dynamic correction factor based on the second measured power value associated with the second time and the first value of the dynamic correction factor.

19 Claims, 12 Drawing Sheets

(56) References Cited

U.S. PATENT DOCUMENTS

2014/0337002 A1 11/2014 Manto
2017/0220708 A1* 8/2017 He .................. G06F 17/504

OTHER PUBLICATIONS

C. Voyant, et al., "Statistical Parameters as a Means to Priori Assess the Accuracy of Solar Forecasting Models" HAL archives-ouvertes, Jul. 24, 2015, p. 1-20.

C.W. Hansen, et al., "Simulation of Photovoltaic Power Output for the Salt River Project Integration Study" Sania National Laboratories, Nov. 2012, pp. 1-42.

M. J. Reno, et al., "Global Horizontal Irradiance Clear Sky Models: Implementation and Analysis", Sandia Report, Mar. 2012, p. 1-68.

P.J. Smith, et al., "Adaptive correction of deterministic models to produce probabilistic forecasts", Hydrol Earth System Sciences, Aug. 16, 2012, p. 1-17.

Z. Dong, et al., "Short-term Solar Irradiance Forecasting Using Exponential Smoothing State Space Exponential Smoothing State Space Model" Solar Energy Research Institure of Singapore, National University of Singapore, May 18, 2013, pp. 1-11.

* cited by examiner

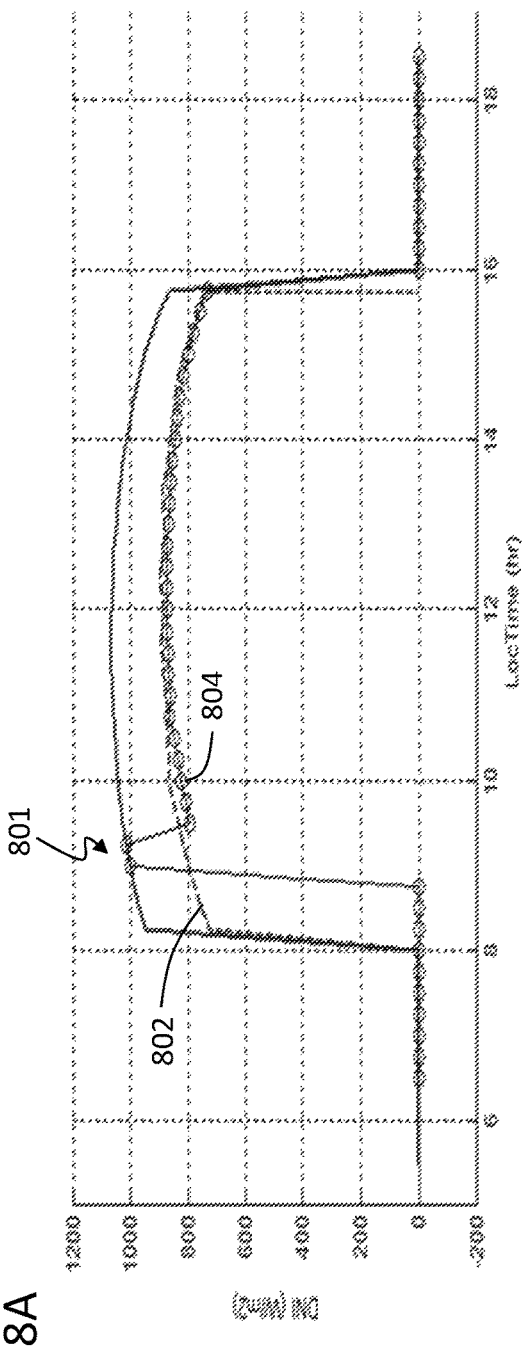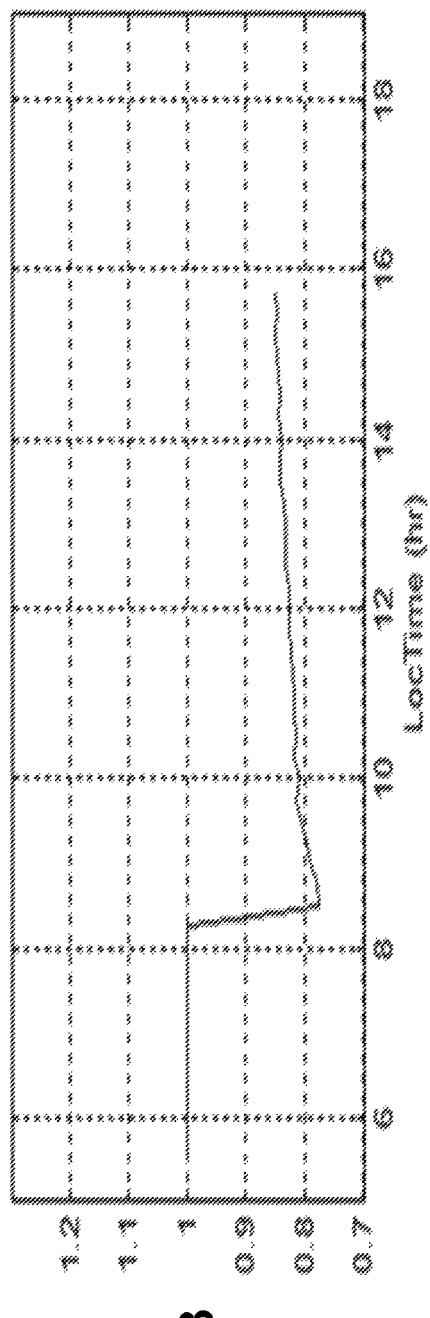
FIG. 8A
FIG. 8B

REAL-TIME ESTIMATION OF SOLAR IRRADIATION

STATEMENT REGARDING FEDERALLY SPONSORED RESEARCH OR DEVELOPMENT

This invention was made with Government support under Contract No. DE-EE0006017 awarded by the Department of Energy. The Government has certain rights to this invention.

BACKGROUND

The present disclosure relates generally to estimating solar power at a sensor location and, more specifically, to real-time estimation of solar irradiation.

Solar irradiation received by a photovoltaic energy conversion system may deviate from theoretical values throughout a day even in the absence of visible clouds or other visible obstructions. For example, particles, humidity, pollutants, etc. may cause diffraction and absorption of solar energy as it travels through the atmosphere. Analysis of field collected data collected shows that the direct irradiation power loss can be as high as 20% of a corresponding theoretical power. Depending on the atmospheric conditions, the percentage loss can be fixed, linear, and/or non-linear with time throughout a clear day. Thus forecast accuracy may be degraded due a variable loss factor at a given solar conversion facility.

Mathematical analysis may be used to provide a compensation factor that may be used to adjust a predicted solar power. For example, a mathematically predicable irradiance value may be scaled by a fixed parameter for a given location based on past measurements. Forecasting methods employing fixed parameters may be simple to implement but may not account for variations in atmospheric conditions throughout a day. Thus, improved prediction tools are desired.

SUMMARY

According to embodiments, a method, system, and computer program product are provided for estimating future levels of solar power received at a location by a sensor including receiving, by a processor, a first measured power value at a first time from the sensor, calculating a first value of a dynamic correction factor based on the first measured power value associated with the first time, applying the first value of the calculated dynamic correction factor to a power estimation model, generating a first power estimation value for a second time using the power estimation model, wherein the second time is later than the first time, receiving a second measured power value at the second time, and calculating a second value of a dynamic correction factor based on the second measured power value associated with the second time and the first value of the dynamic correction factor.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 8A is a schematic plot of measured data and modeled power forecasts for direct normal irradiance solar power as a function of time in accordance with an embodiment of the present disclosure;

FIG. 8B is a schematic plot of values of a dynamic correction factor as a function of time, related to the modeled power forecast of FIG. 8A.

DETAILED DESCRIPTION

Embodiments described herein are directed to irradiance estimation(s) on a cloudless day, i.e., solar power predictions for a cloudless day. In some embodiments, a method to integrate measured irradiance data at discrete time instances into an energy forecasting process is provided. Data integration may be achieved in such a way that a deviation from a predicated value and subsequently measured value may be minimized by periodically updating a scaling parameter. In some embodiments, the scaling parameter, used in predicting, may be represented as an unknown "random-walk" variable. In some embodiments, the value of the random variable may be periodically updated as new measurements of solar irradiation are made available to an estimator. Further, field irradiance data derived from ground-based sensors may be used to demonstrate the effectiveness of the method. Furthermore, in some embodiments, enhancement to a random-walk model may be achieved in the form of a "random-ramp" process.

Accurate forecasting of solar power generated by ground-based solar panels is important for smarter grid integration of renewable energy. Solar power received under ideal cloudless conditions may be mathematically predicted or predictable for a given location at a specific time of day. However, two factors may complicate a prediction or forecasting of the received solar power. First, on a seemingly clear day, solar radiation energy may be scattered and absorbed by atmospheric elements such as water, dust particles, etc. resulting in a deviation from a mathematically predicted value. Furthermore, atmospheric conditions may change throughout a day and thus a level or amount of scattering and absorption may also change as the atmospheric conditions change. Second, on a partially cloudy day, abrupt changes between clear and cloudy conditions due to cloud motion may create artificial transients in forecast or predicted values. Accurate and/or realistic forecasting, thus, must account or compensate for both issues described above.

A mathematically predicable irradiance value may be scaled by a fixed parameter for a given location based on past measurements. A forecasting method or tool employing fixed parameter(s) may be simple to implement but may not account for variation(s) in atmospheric conditions throughout a day. Evaluation of field data confirms that irradiation received by ground based sensors can deviate as much as 20% from the ideal or predicted value.

Figure 1:
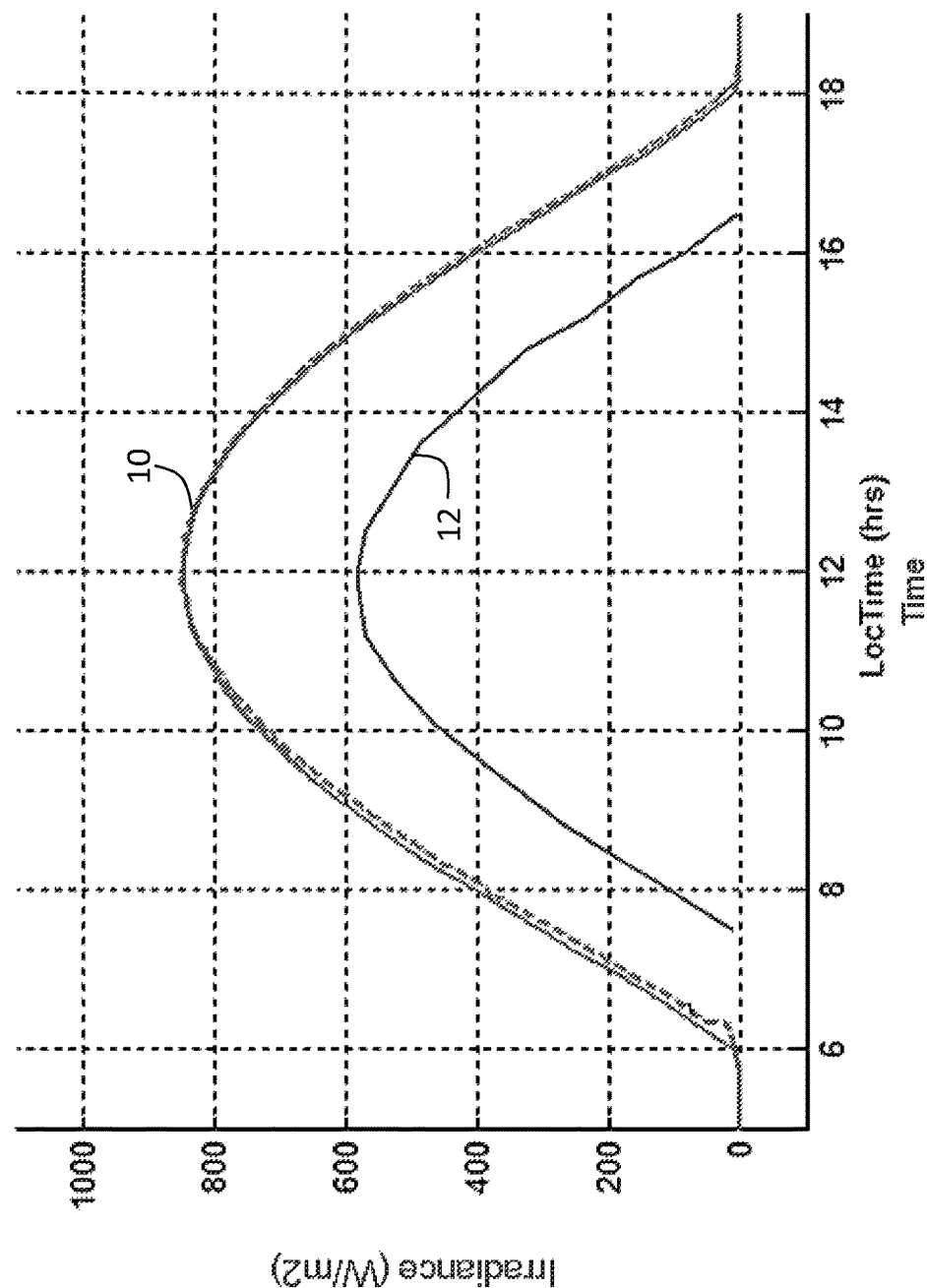
FIG. 1 is an illustration of solar power as a function of time.

Deviation may result from time of day, atmospheric conditions, etc. For example, even on a clear day, irradiation received at a location may starts near 0 W/m² just before sunrise, gradually increases to a peak value near noon, and decreasing gradually to 0 W/m² following sunset. Further, depending on the season, the amount of solar power may vary. For example, as shown in FIG. 1, a peak value can reach as high as 850/m² in the summer (line 10) and as low as 600 W/m² in the winter (line 12), at a given location. Further, as shown in FIG. 1, the amount of power may vary throughout the day, starting at, for example, about 6:00 AM (sunrise) and ending at about 6:00 PM (sunset), in the summer (line 10) or about 7:30 AM (sunrise) and ending at 4:30 PM (sunset), in the winter (line 12). The power curves shown in FIG. 1 may be estimated by mathematical formulae.

Figure 2:
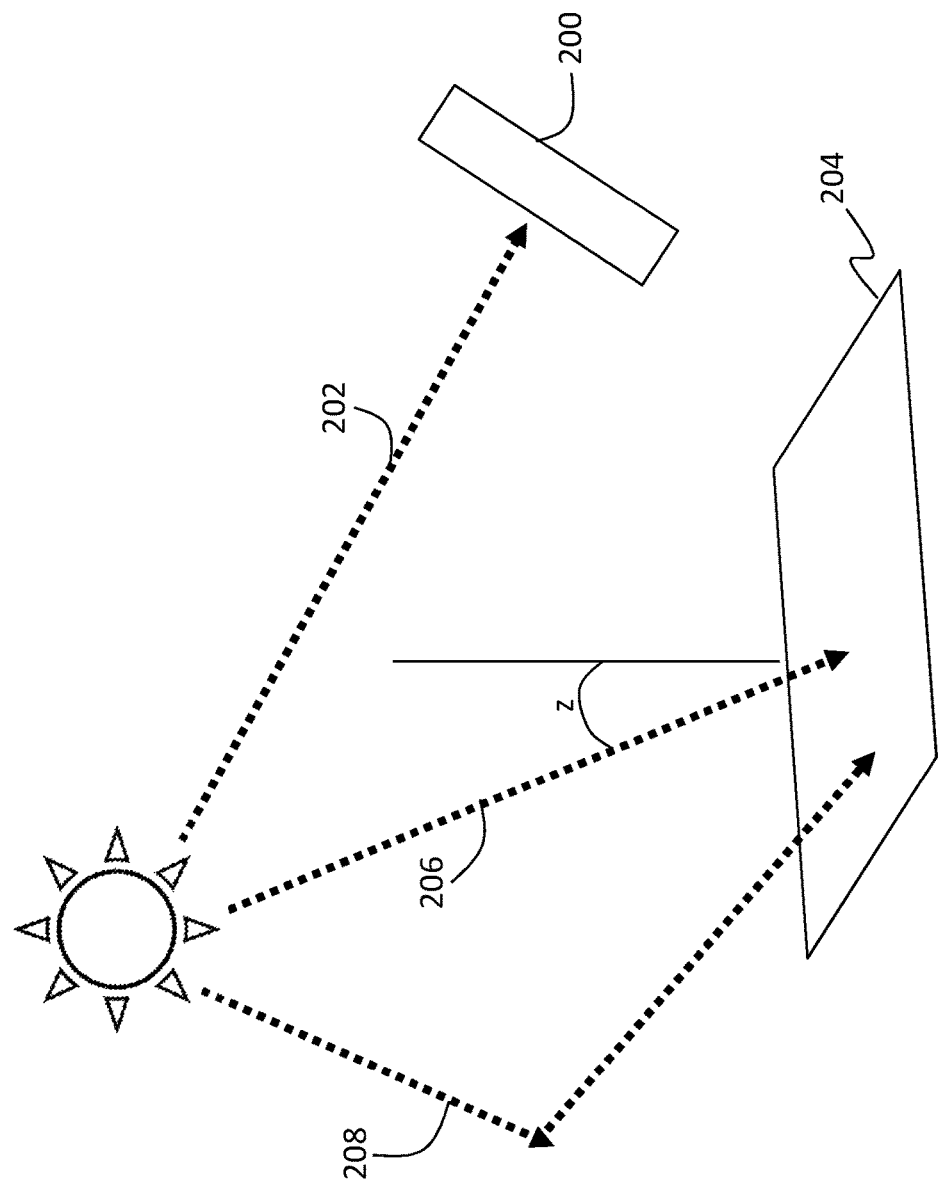
FIG. 2 is a schematic illustration of different types of measurements for calculating solar power.

The amount of solar power at a given location may be estimated in various ways. For example, with reference to FIG. 2, sunlight may impact a tracking sensor 200 directly or indirectly, and some of the light may be diffracted, reflected, or otherwise transmitted from the sun to the tracking sensor 200. Direct Normal Irradiance (DNI) is the power received by the tracking sensor 200 positioned or angled orthogonal to the impinging rays, e.g., direct rays 202. A DNI measurement system (or estimation) excludes rays impinging on it due to diffraction. In contrast, Global Horizontal Irradiance (GHI) is a measure of power received by a fixed sensor 204 mounted horizontally. The GHI measurement is strongly dependent on the zenith angle "z," as shown in FIG. 2. GHI sensor system captures both rays arriving directly to the sensor (e.g., rays 206) as well as the rays diffracted by the atmospheric particles and rays reflected by neighboring objects, such as mountain surface (e.g., rays 208). In some systems, around noon, the DNI measurement may tend to be higher than that of GHI due to the non-zero zenith angle in most locations around the globe.

Average radiation that reaches the atmospheric surface is about 1367.7 W/m². Due to variation in sun-to-earth distance a correction is added to the above power density as follows:

$$I_0 = 1367.7 \times \left(1 + 0.033 \times \cos\left(\frac{2\pi \times DOY}{365}\right)\right) W/m^2 \qquad \text{Eq. (1)}$$

In Eq. (1), DOY is the day of the year on a 1 to 365 scale. Once $I_0$ is computed according to eq. (1) for a particular day DOY, DNI for a given zenith angle z (deg) and altitude or elevation h (km) is calculated using, for example, a Laue Model:

$$I_{DNI} = I_0 \times ((1-0.14 \times h) \times 0.7^{AM^{0.678}} + 0.14 \times h) W/m^2 \qquad \text{Eq. (2)}$$

In Eq. (2), the air mass $$AM = \frac{1}{\cos(z)}.$$

Due to local atmospheric condition(s), actual or measured $I_{DNI}$ may not match a computed or estimated value given by Eq. (2). In order compensate for this difference, historical records and/or data at the location of the sensor may be used to estimate a fixed correction factor $k_{DNI}$ so that a corrected $I_{DNI}$ (hereinafter: $I_{CDNI}$) may be calculated as follows:

$$I_{CDNI} = k_{DNI} \times [I_0 \times ((1-0.14 \times h) \times 0.7^{AM^{0.678}} + 0.14 \times h)] \qquad \text{Eq. (3)}$$

Figure 3A:
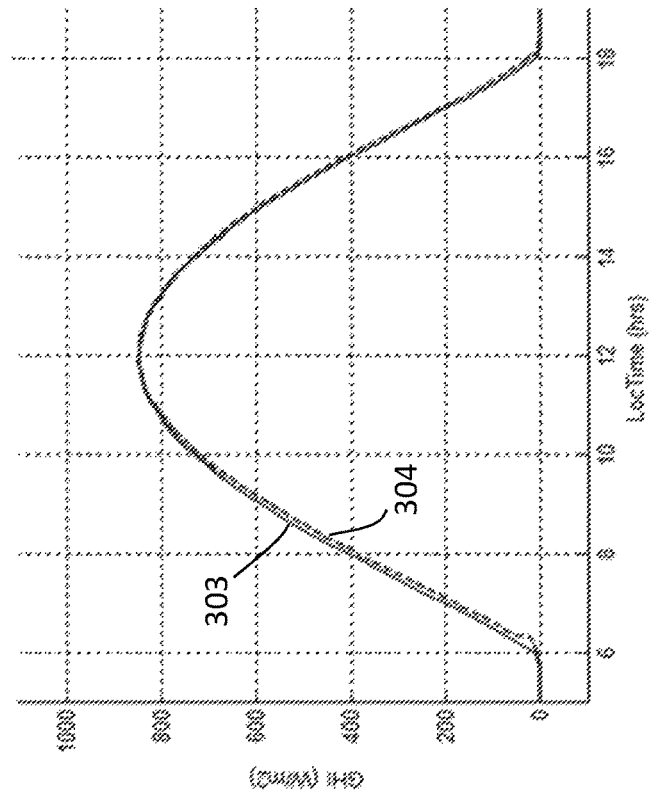
FIG. 3A is a schematic plot of direct normal irradiance solar power as a function of time.

As shown in FIG. 3A, a clear-day example showing a model having a relative match between a fixed correction factor model for DNI (line 301; e.g., an $I_{CDNI}$ model) and measured data (line 302) at a particular sensor is shown. As shown, there is some variance, offset, and/or error between the $I_{CDNI}$ model prediction and the measured received power at the sensor.

Similarly, GHI can be computed using similar steps taken for DNI using, for example, a Robledo-Soler model:

$$I_{GHI} = I_0 \times (\cos z)^{1.179} \times e^{(-0.0019 \times (90-z))} \qquad \text{Eq. (4)}$$

A similar correction term may be added based on historical records and/or data at the location of the sensor such that, using a fixed correction factor $k_{GHI}$, a corrected $I_{GHI}$ (hereinafter: $I_{CGHI}$) may be calculated as follows:

$$I_{CGHI} = k_{GHI} \times I_0 \times (\cos z)^{1.179} \times e^{(-0.0019 \times (90-z))} \qquad \text{Eq. (5)}$$

Figure 3B:
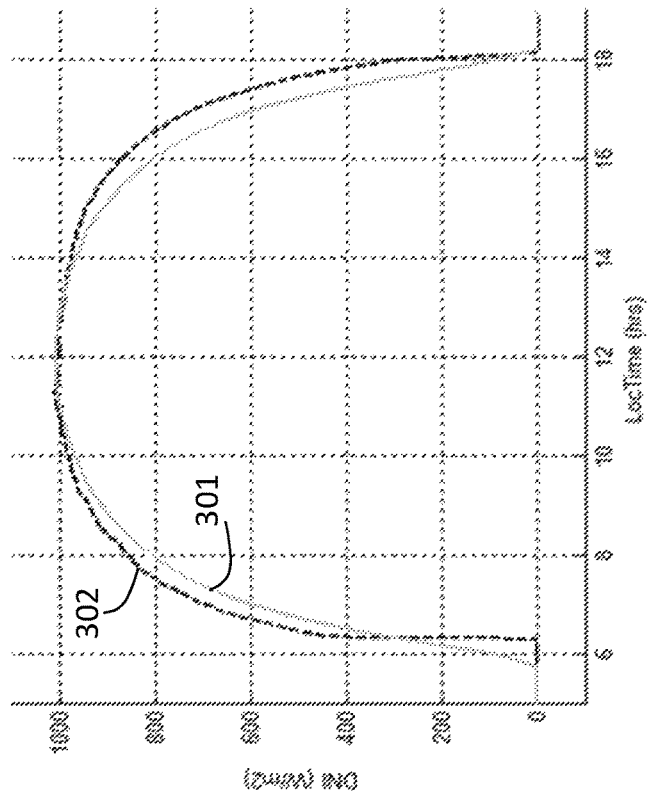
FIG. 3B is a schematic plot of direct global horizontal irradiance solar power as a function of time.

FIG. 3B shows a clear day example for GHI modeling and measured data.

The match between the computed or estimated GHI (line 303; e.g., an $I_{CGHI}$ model) and the measured data (line 304) is shown as a good fit. However, such accurate fits may not be achieved on a daily basis for a clear sky case.

Equations (2) and (4), described above, may provide a model-based computation of the respective powers $I_{DNI}$ and $I_{GHI}$. However, as noted, a fixed correction factor for each power (e.g., $k_{DNI}$ and $k_{GHI}$) may be independently estimated based on historic data. The fixed correction factors, as demonstrated in FIGS. 3A and 3B, may provide a close approximation. However, the amount of error and/or deviation from the actual, measured data may result in improper estimations of power collection at a particular sensor. This may be particularly important when an owner of a solar power plant or solar generator intends to estimate power production in advance of actual power generation (e.g., to sell power).

Accordingly, as provided herein, processes and systems for enabling a more accurate power collection models are provide. For example, processes and methods for continuously updating and/or generating a correction factor throughout a day, e.g., as new sensor-based measurements are made available, are provided. That is, a dynamic or variable correction factor may be used to provide an accurate estimation of power collection at a particular sensor or location.

To provide a variable or dynamic correction factor, the above described and defined power models ($I_{DNI}$ and $I_{GHI}$) may be modified with a different correction factor than that described above (wherein the prior correction factor was fixed). In the following description, the base power-models of Eq. (2) ($I_{DNI}$) or eq. (4) ($I_{GHI}$) will be denoted by $P_{model}$ for conciseness and consistency. Those of skill in the art will appreciate that the following dynamic correction factor and related process may be used for both the Direct ($I_{DNI}$) and Global ($I_{GHI}$) models.

As discussed above, a fixed correction factor k was described for each of the models (see, Eq. (3) and Eq. (5)). The fixed correction factor k was based on historical data or records to generate the fixed correction factor for a particular location and/or sensor. To distinguish the fixed correction factor k of Eq. (3) or Eq. (5), a dynamic correction factor as provided herein will be represented as a random-walk process $\beta$ and is estimated, as discussed below, using a new stream of irradiation measurements, e.g., as data is collected throughout a single day, the dynamic correction factor $\beta$ will be updated using data from that same day.

As a continuous time (t) domain variable $\beta$ may be represented as follows:

$$\frac{d\beta(t)}{dt} = 0 + w(t) \quad \text{Eq. (6)}$$

Equation (6) represents a stochastic model for a random or dynamic constant $\beta$ in which $w(t)$ is a random variable yet to be determined. A discrete time equivalent of eq. (6) is as follows:

$$\beta(n) = \beta(n-1) + T^* w(n) \quad \text{Eq. (7)}$$

In Eq. (7), T is a measurement sampling time.

In the context of estimation methodology, an explicit value of $w(n)$ is not required. Instead, the dynamic correction factor $\beta$ may be updated according to the following estimator algorithm:

$$\beta(n^+) = \beta(n^-) + L^*[P_m(n) - P_e(n^-)] \quad \text{Eq. (8)}$$

In Eq. (8), $P_m(n)$ is the measured power at instance n and $P_e(n^-)$ is the estimated power at instance $n^-$. As such, in Eq. (8), $n^+$ denotes an updated value of a variable, in this case $\beta$, at instant n after a measured sensor-based data point is acquired. Note that the power generated at a given location is proportional to the corresponding power density of solar irradiance at that location. Further, L is an estimator gain constant that is chosen to meet a design specification. For example, in one application, L=0.001 provided a stable estimator transient response without overshoot. The magnitude of L generally depends on sampling time interval and dynamics of the system under consideration. In accordance with some embodiments, L may be determined through a trial-and-error iterative process. The estimator algorithm Eq. (8) may resemble a "Kalma-filter" like structure. The value of the estimator gain constant L may affect the response time of the filter to changes in atmospheric conditions. For example, a relatively higher estimator gain constant L value may make the estimator algorithm Eq. (8) respond quickly to changes but may generate artificial ripples, and, in contrast, a relatively lower estimator gain constant L value may create a slow response to changes in atmospheric conditions.

Using the above described estimator algorithm Eq. (8), estimated power at a location or sensor may be estimated using either Eq. (3) or Eq. (5) with a corresponding $\beta((n-1)^+)$ as defined by:

$$P_e(n^+) = \beta(n^+) * P_{model}(n) \quad \text{Eq. (9)}$$

Figure 4:
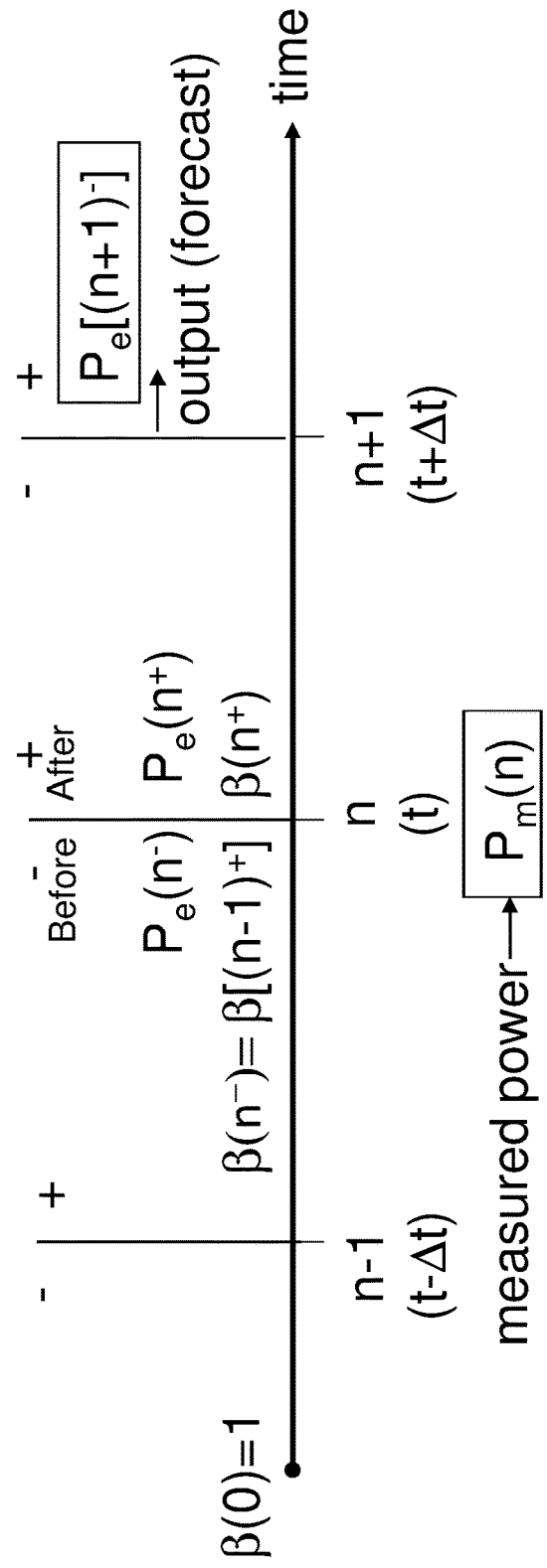
FIG. 4 is a schematic of a flow process and logic in accordance with an embodiment of the present disclosure for calculating a dynamic correction factor for power estimation models.

Referring now to FIG. 4, a schematic of sampling instances with corresponding variables employing a process in accordance with an embodiment of the present disclosure is shown. On the left side of FIG. 4 is a time 0 or initial or first instance, with time progressing to the right in the figure. In FIG. 4, the present time is t. Measurements may be made at a time interval of $\Delta t$. When the process begins, no known measurements have been obtained, and thus, on the far left, at t=0, the dynamic correction factor $\beta$ is equal to 1 (i.e., $\beta(0)=1$).

At a given time t, it may be advantageous to provide a prediction or forecast for the next desired time or time period, which may be a time interval of $\beta t$ in the future. Accordingly, at instance n the time may be t, the measurement prior in time may be n−1 taken at time $t-\Delta t$, and the next measurement in time will be instance n+1 taken at time $t+\Delta t$, as indicated in FIG. 4.

At a given time t, the dynamic correction factor may be given as $\beta(n^-) = \beta[(n-1)^+]$ and a model-based power $P_{model}(n)$ may be a function of the day (of 365), the time, and the location, such as described above with respect to Eq. (2) and/or Eq. (4). A power estimation prior to instance n at time t may be given by $P_e(n^-)$, and a power estimation after an instance n at a time t may be given by $P_e(n^+)$. Further, the dynamic correction factor $\beta$ prior to instance n at time t may be given by $\beta(n^-) = \beta[(n-1)^+]$, and a dynamic correction factor $\beta$ after an instance n at a time t may be given by $\beta(n^+)$. The measured power at instance n at time t may be represented by $P_m(n)$.

Thus, the estimated power at a prior instance/time ($n^-$; $t-\Delta t$) may be given by: $P_e(n^-) = \beta(n^-) P_{model}(n)$. The dynamic correction factor $\beta$ may be updated at instance n at time t as provided by: $\beta(n^+) = \beta(n^-) + L[P_m(n) - P_e(n^-)]$. Thus, the estimated power, $P_e$, in the future $n^+$ may be given by: $P_e(n^+) = \beta(n^+) P_{model}(n)$. A forecast for the power at instance n+1 may be given by: $P_e[(n+1)^-] = (n^+) P_{model}(n+1)$.

In order to forecast a single-sample ahead value for estimated power, the most recent value of $\beta = \beta(n^+)$ is leveraged as follows:

$$P_e[(n+1)^-] = \beta(n^+) * P_{model}(n+1) \quad \text{Eq. (10)}$$

As will be appreciated by those of skill in the art, multiple sampling instances into the future may be achieved (e.g., m steps), the same computation similar to Eq. (10) may be repeated with corresponding model-based power values of $P_{model}(n+m)$:

$$P_e[(n+m)^-] = \beta(n^+) * P_{model}(n+m) \quad \text{Eq. (11)}$$

For example, in one non-limiting embodiment, if a sampling interval is 15 minutes (e.g., $\Delta t=15$ minutes), a 1 hour ahead forecast would require m=4 sampling steps. During the 1 hour period the Sun's azimuth angle z changes and $P_{model}(n+m)$ will account for the expected change on a clear day. The random-walk model will be frozen to a constant value $\beta(n^+)$ according to the formulation defined by Eq. (6). Higher order models for the time evolution of the dynamic correction factor $\beta$ can be augmented to allow for change in the value m steps ahead. For example a random-ramp would allow the dynamic correction factor $\beta$ to change linearly with time.

In such an example, the Eq. (6) may be expanded as follows:

$$\frac{d\beta(t)}{dt} = \beta_{dot}(t) + w_1(t) \qquad \text{Eq. (12a)}$$

$$\frac{d\beta_{dot}(t)}{dt} = 0 + w_2(t) \qquad \text{Eq. (12b)}$$

Equations (12a) and (12b) include an added variable $\beta_{dot}(t)$ to provide a time rate of change for $\beta(t)$. Two noise processes $w_1$ and $w_2$ drive the stochastic model for $\beta$.

In a discretized form the estimation equations will appear as follows:

$$\beta(n^+) = \beta(n-1) + T*\beta_{dot}(n-1) + L_1[P_m(n) - P_e(n)] \qquad \text{Eq. (13a)}$$

$$\beta_{dot}(n^+) = \beta_{dot}(n-1) + L_2[P_m(n^-) - P_e(n)] \qquad \text{Eq. (13b)}$$

The estimator gain constants $L_1$ and $L_2$ may be used to complete the estimation step in Eq. (13a) and Eq. (13b), respectively. Once the updated values for $\beta(n^+)$ and $\beta_{dot}(n^+)$ are obtained using Eq. (13a) and Eq. (13b), m step ahead forecast for $\beta(n+m)$ can be made as follows:

$$\beta(n+m) = \beta(n^+) + m*T*\beta_{dot}(n^+) \qquad \text{Eq. (14)}$$

The random-ramp model for irradiation correction factor $\beta$ may account for changes in atmospheric conditions throughout a day much more closely than a random-walk model.

The power forecast model of Eq. (11) may be modified to include the forecast value of $\beta(n+m)$ as follows:

$$P_e[(n+m)^-] = (n+m)*P_{model}(n+m) \qquad \text{Eq. (15)}$$

Figure 5A:
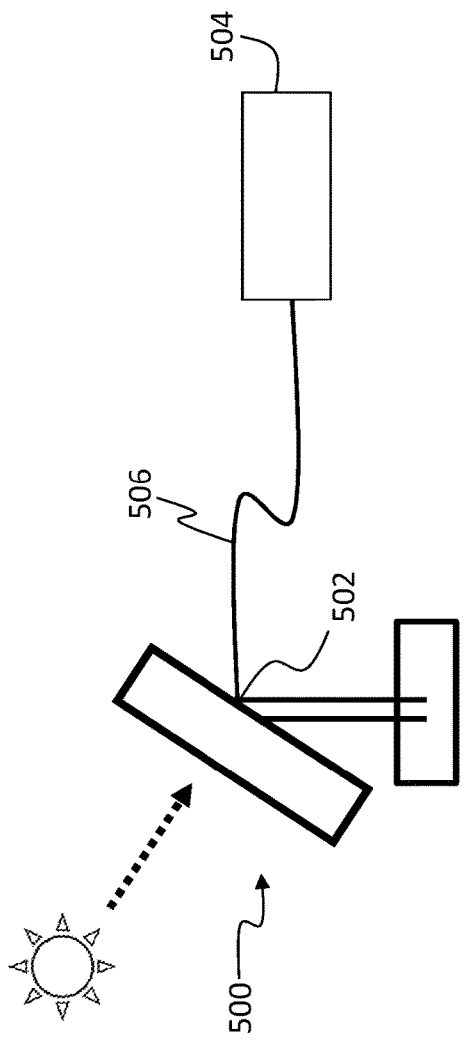
FIG. 5A is a schematic illustration of a system in accordance with an embodiment of the present disclosure.
Figure 5B:
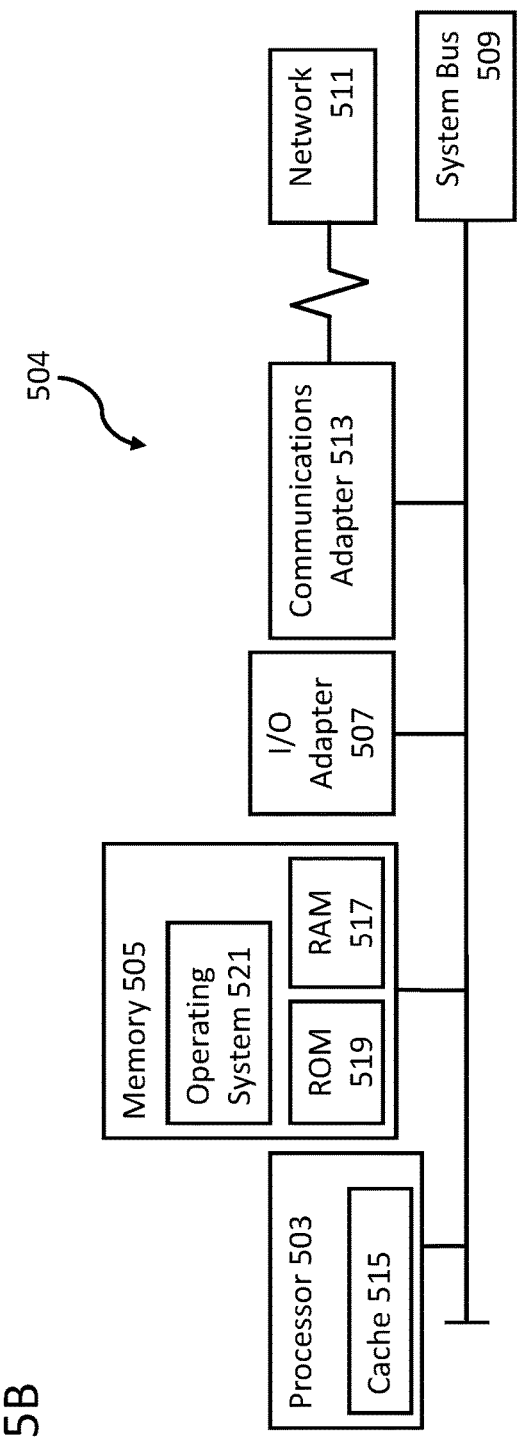
FIG. 5B is a block diagram schematic of a computing system that may be employed in the system of FIG. 5A.

Turning now to FIGS. 5A and 5B, a power estimation system 500 in accordance with an embodiment of the present disclosure is shown. FIG. 5A is a schematic illustration of the power estimation system 500 having a sensor 502 and a computing system 504. FIG. 5B is a block diagram of the computing system 504 for use in practicing the embodiments described herein is shown.

The sensor 502 may be a solar panel or other sensor configured to detect an amount of sun light (and thus power) received at the sensor 502. The sensor 502 may be operably connected to and/or in communication with the computing system 504 by means of a communications line 506. In some embodiments, the sensor 502 and the computing system 504 may be a single unit, with the communications line 506 being formed as a bus or other electrical communication. In other embodiments, the sensor 502 may be separate from the computing system 504 and the communications line 506 may be a wired or wireless communications protocol and associated hardware/software.

The above described power estimation may be performed within the computing system 504 to provide a user with a power estimation such that the user may make adjustments, sell power, etc. The methods and processed described herein, e.g., the power estimation computation described above, can be implemented in hardware, software (e.g., firmware), or a combination thereof. In some embodiments, the methods described herein may be implemented in hardware, and may be part of the microprocessor of a special or general-purpose digital computing system.

In the non-limiting embodiment of FIG. 5B, in terms of hardware architecture, the computing system 504 includes a processor 503. The computing system 504 also includes memory 505 coupled to the processor 503, and one or more input and/or output (I/O) adapters 507, that may be communicatively coupled via a local system bus 509. The memory 505 may be operatively coupled to one or more internal or external memory devices accessed through a network 511. A communications adapter 513 may operatively connect the computing system 504 to the network 511 or may enable direct communication between the computing system 504 and a remote device (e.g., a smartphone, tablet, local computer, etc.). In some embodiments, the communications adapter 513 may connect the computing system 504 with the sensor 502.

The processor 503 may be a hardware device for executing hardware instructions or software that may be stored in a non-transitory computer-readable memory (e.g., memory 505) or provided from an external source through the network 511. The processor 503 can be any custom made or commercially available processor, a central processing unit (CPU), a plurality of CPUs, an auxiliary processor among several other processors associated with the computing system 504, a semiconductor based microprocessor (in the form of a microchip or chip set), a macroprocessor, or generally any device for executing instructions. The processor 503 can include a memory cache 515. The processor 503 may be configured to perform power estimation as described herein.

The memory 505 can include random access memory (RAM) 517 and read only memory (ROM) 519. The RAM 517 can be any one or combination of volatile memory elements (e.g., DRAM, SRAM, SDRAM, etc.). The ROM 519 can include any one or more non-volatile memory elements (e.g., erasable programmable read only memory (EPROM), flash memory, electronically erasable programmable read only memory (EEPROM), programmable read only memory (PROM), tape, compact disc read only memory (CD-ROM), disk, cartridge, cassette or the like, etc.). Moreover, the memory 505 may incorporate electronic, magnetic, optical, and/or other types of non-transitory computer-readable storage media. As will be appreciated by those of skill in the art, the memory 505 can have a distributed architecture, where various components are situated remote from one another, but can be accessed by the processor 503.

The instructions in the memory 505 may include one or more separate programs, each of which comprises an ordered listing of computer-executable instructions for implementing logical functions. In the example of FIG. 5B, the instructions in the memory 505 may include a suitable operating system 521. The operating system 521 can control the execution of other computer programs and provide scheduling, input-output control, file and data management, memory/storage management, communication control, and related services. For example, the operating system 521 may be an operating system for a power estimation tool and/or power generation estimation tool that includes the processor 503 and other associated components as shown and described in computing system 504, including but not limited to the sensor 502.

The I/O adapter 507 can be, for example but not limited to, one or more buses or other wired or wireless connections, as is known in the art. The I/O adapter 507 may have additional elements, which are omitted for simplicity, such as controllers, buffers (caches), drivers, repeaters, and receivers, to enable communications. In some embodiments, the I/O adapter 507 may be operably and/or communicably connected to the sensor 502 (as opposed to a connection through network 511).

As noted, the computing system 504 may include a communications adapter 513 for coupling to the network 511 or coupling the computing system 504 to a local device, such as a smartphone, tablet, local computer, etc. As such, in some embodiments, the communications adapter 513 may be a wireless connection device that may enable wireless communication. For example, in some embodiments, the communications adapter 513 may enable Bluetooth® communication and/or NFC communications. Further, in some embodiments, the communications adapter 513 may enable Wi-Fi or other internet communications. Further, in some embodiments, wired communication may be enabled through the communications adapter 513. As will be appreciated by those of skill in the art, various combinations of communications protocols may be used without departing from the scope of the present disclosure.

The network 511 can be an IP-based network for communication between computing system 504 and any external device(s). The network 511 enables transmissions of data between the computing system 504 and external systems. In a non-limiting embodiment, the network 511 can be a managed IP network administered by a service provider. The network 511 may be implemented in a wireless fashion, e.g., using wireless protocols and technologies, such as WiFi, WiMax, etc. The network 511 can also be a packet-switched network such as a local area network, wide area network, metropolitan area network, Internet network, or other similar type of network environment. The network 511 may be a fixed wireless network, a wireless local area network (LAN), a wireless wide area network (WAN) a personal area network (PAN), a virtual private network (VPN), intranet or other suitable network system.

In some embodiments, the instructions in the memory 505 may further include a basic input output system (BIOS) (omitted for simplicity). The BIOS is a set of essential routines that initialize and test hardware at startup, start the operating system 521, and support the transfer of data among the operatively connected hardware devices. The BIOS may be stored in the ROM 519 so that the BIOS can be executed when the computing system 504 is activated. When the computing system 504 is in operation, the processor 503 may be configured to execute instructions stored within the memory 505, to communicate data to and from the memory 505 and/or remote devices through the network 511, and to generally control operations of the computing system 504 pursuant to the instructions.

The following is an example of an application of the present processes and methods as may be executed and performed by a power estimation system 500 as shown in FIGS. 5A and 5B. FIGS. 6-12 are provided as an example showing data points at a specific location of a sensor wherein the above described estimation processes were used to provide estimations of power at the sensor. A comparison between the fixed correction factor and the dynamic correction factor (as described above) is provided.

GHI and DNI data for a specific location was obtained using a sensor connected to a computing system. Both fixed correction factor models (e.g., fixed correction factor k; Eqs. (1)-(5)) and dynamic correction factor models (e.g., dynamic correction factor fl; Eqs. (6)-(11)) were used. Further, actual power values were measured by a sensor at the specific location. Thus, a comparison of the various models with actual measured data was achieved.

Figure 6:
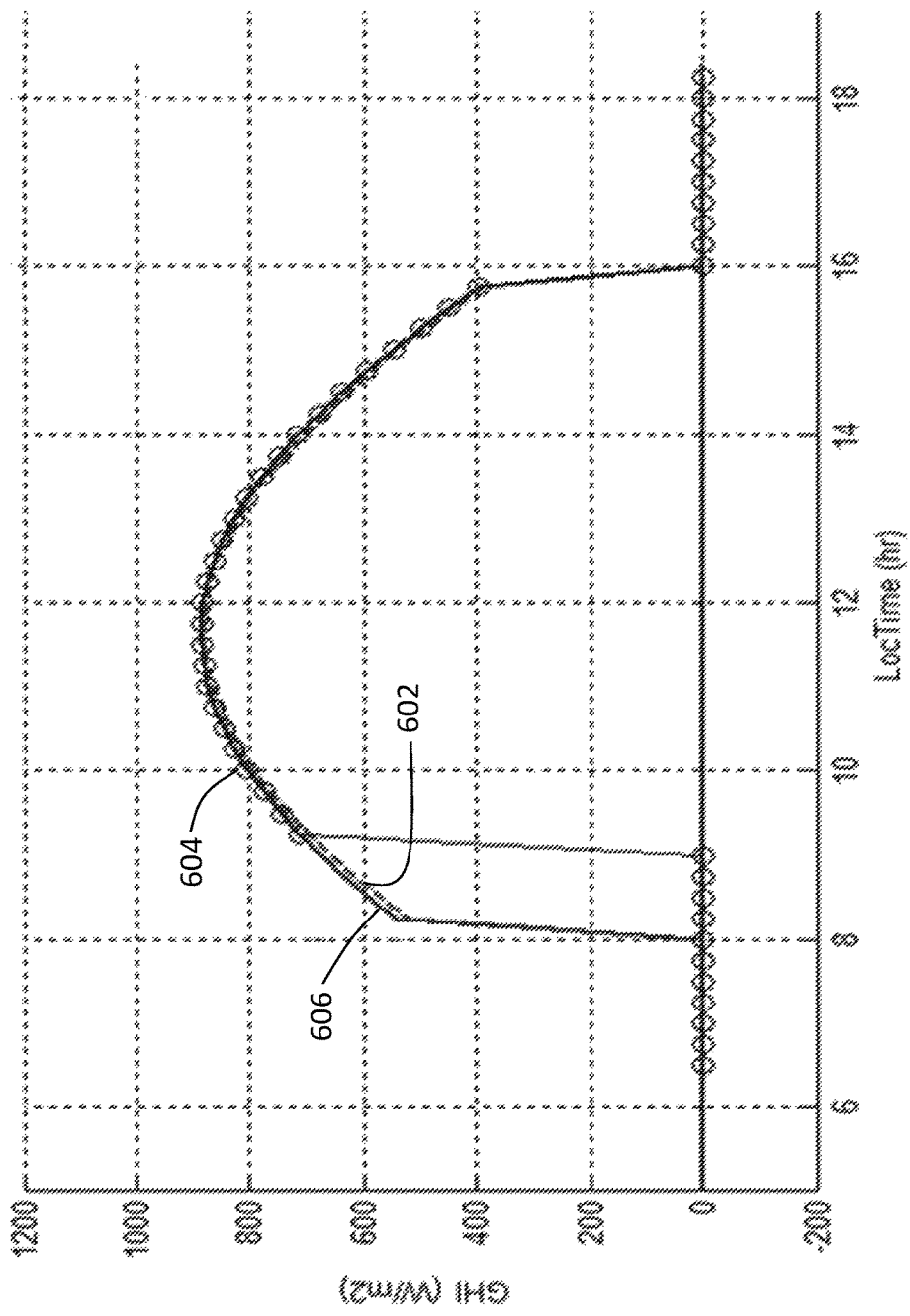
FIG. 6 is a schematic plot of measured data and modeled power forecasts for global horizontal irradiance (GHI) solar power as a function of time.
Figure 7:
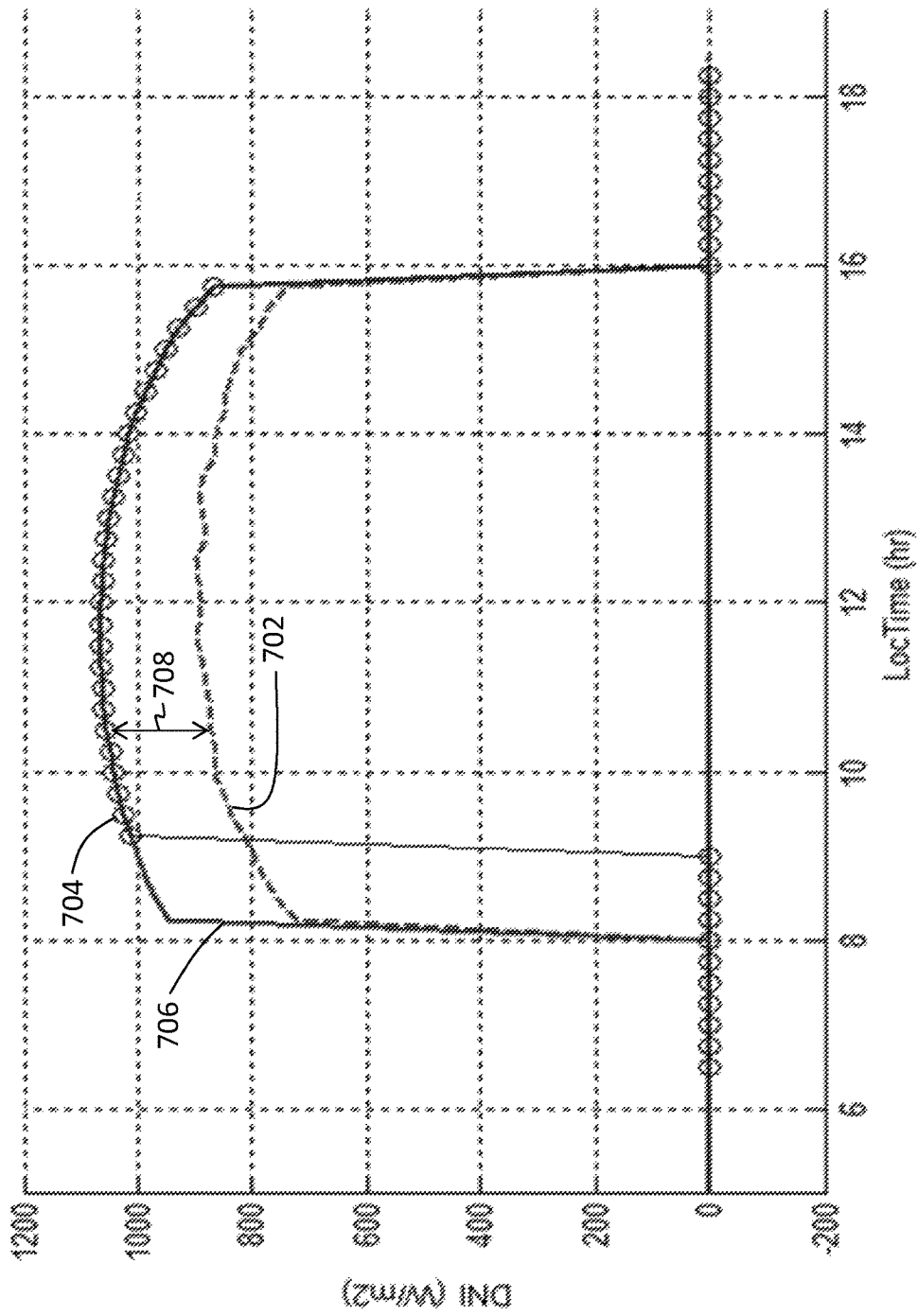
FIG. 7 is a schematic plot of measured data and modeled power forecasts for direct normal irradiance (DNI) solar power as a function of time.

Referring to FIGS. 6 and 7, examples of power data and estimation for GHI (FIG. 6) and DNI (FIG. 7) are shown. Power as measured by a sensor is shown as dashed lines 602, 702, for FIGS. 6 and 7 respectively. A fixed correction factor model (e.g., Eqs. (1)-(5)) is used to generate forecast values 604, 704 (shown as circles) and the model is shown as solid line 606, 706. The forecast values 604, 704 are generated in fifteen minute intervals and configured to provide a one-hour forecast. That is, each forecast value 604, 704 is generated at a fifteen minute interval and incorporates the prior four data points (equaling one hour), as such, the forecast values 604, 704 represent an estimation of the power that will be present one hour into the future.

FIG. 6 shows the forecast value for GHI (circles 604). As shown, the fixed irradiation correction factor model in this case produces very good match with the measurement. However, as shown in FIG. 7, the fixed correction factor model for DNI shows a substantial deviation 708 between the DNI forecast values 704 and the actual measured values (line 702). As a result, the estimated power (forecast value 704) for a time in the future is significantly higher than the actual measured power at that time (line 702).

Turning now to FIGS. 8A and 8B, dynamic correction factor models (e.g., defined by Eqs. (6)-(11)) is applied to generate a one-hour look ahead forecast starting from 8 am for 8 hours (similar to that shown in FIGS. 6 and 7). In this example, a "random-walk" estimator for dynamic correction factor $\beta$ is employed. For a fifteen minute sampling interval, an estimator gain constant L=0.001 generates a stable and ripple free estimate for dynamic correction factor $\beta$.

FIG. 8A shows the enhancement in forecast for DNI at the same location as used for FIG. 7. As shown, after two sampling intervals 801 the dynamic correction factor model is able to track the expected DNI one-hour ahead, as indicated by forecast values 804 matching with the measured values (line 802).

FIG. 8B shows the value of the dynamic correction factor $\beta$ over time, and corresponding to the plot shown in FIG. 8A. The dynamic correction factor $\beta$ has a starting value of $\beta=1$, and, as shown in FIG. 8B is reduced to an optimal value of about 0.8. Due to the process described with respect to Eqs. (6)-(11), the dynamic correction factor $\beta$ is adjusted at each forecast value 804 based on the prior values, and thus, the dynamic correction factor $\beta$ changes over time, throughout the day. This is shown in FIG. 8B as starting at $\beta=1$, dropping to just below $\beta=0.8$, and then increasing throughout the day to finish around $\beta=0.85$. As such, the forecast values enabled by embodiments provided herein are significantly more accurate than a fixed correction factor.

Figure 9:
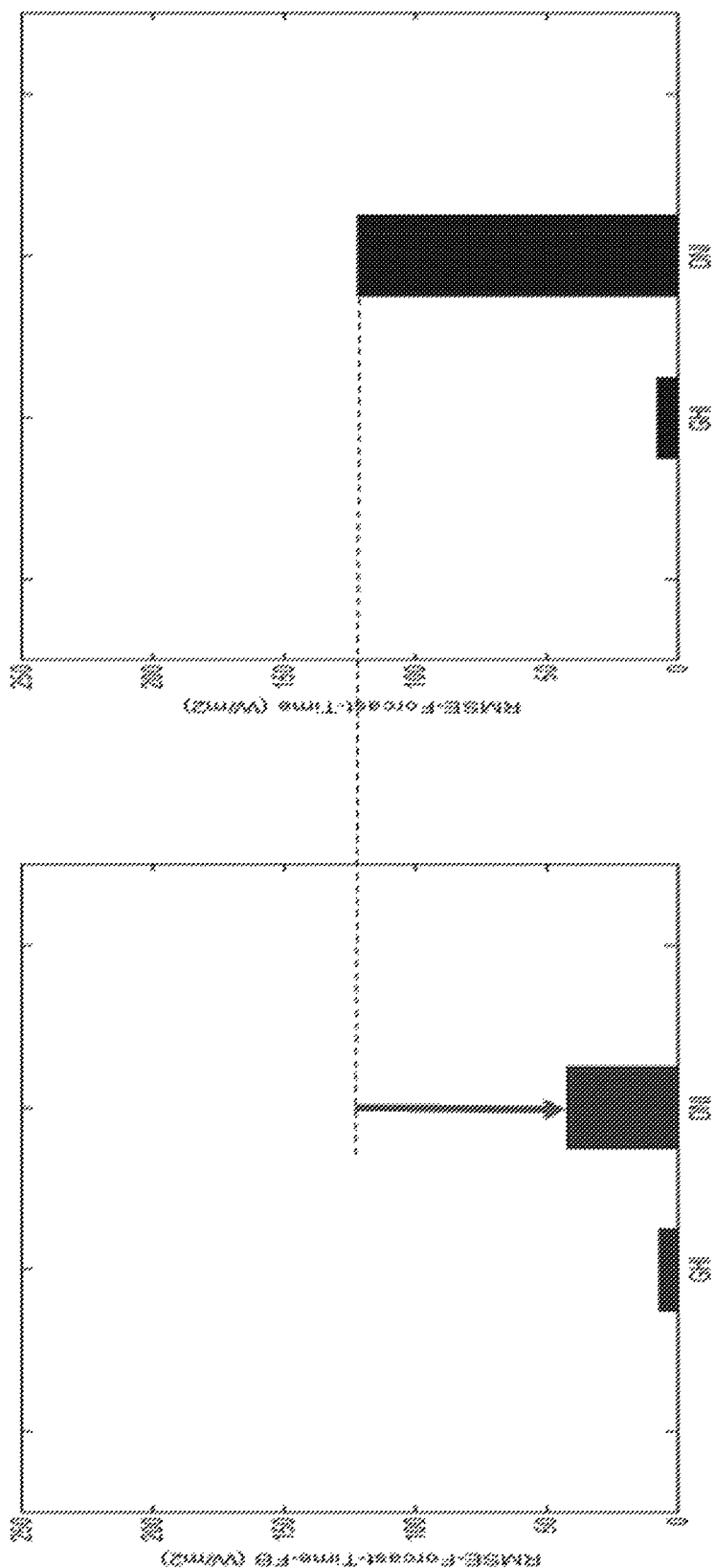
FIG. 9 is a schematic plot illustrating a reduction in error related to modeled power forecasts in accordance with embodiments of the present disclosure.

FIG. 9 shows the relative improvement in one-hour ahead forecast error (RMS). The plot on the left shows the RMS error for both GHI estimation values and DNI estimation values as calculated using the dynamic correction factor model as described herein. The plot on the right shows the RMS error for both GHI estimation values and DNI estimation values as calculated using the fixed correction factor model, described above. As shown, DNI error drops from about 120 W/m$^2$ to about 40 W/m$^2$. This is a substantial reduction due to "random-walk" estimation as achieved by embodiments disclosed herein. The GHI RMS error is also reduced using a dynamic correction factor, although the reduction may be less pronounced (as shown in FIG. 9): from an error of about 8 W/m$^2$ to about 7 W/m$^2$.

Figure 10:
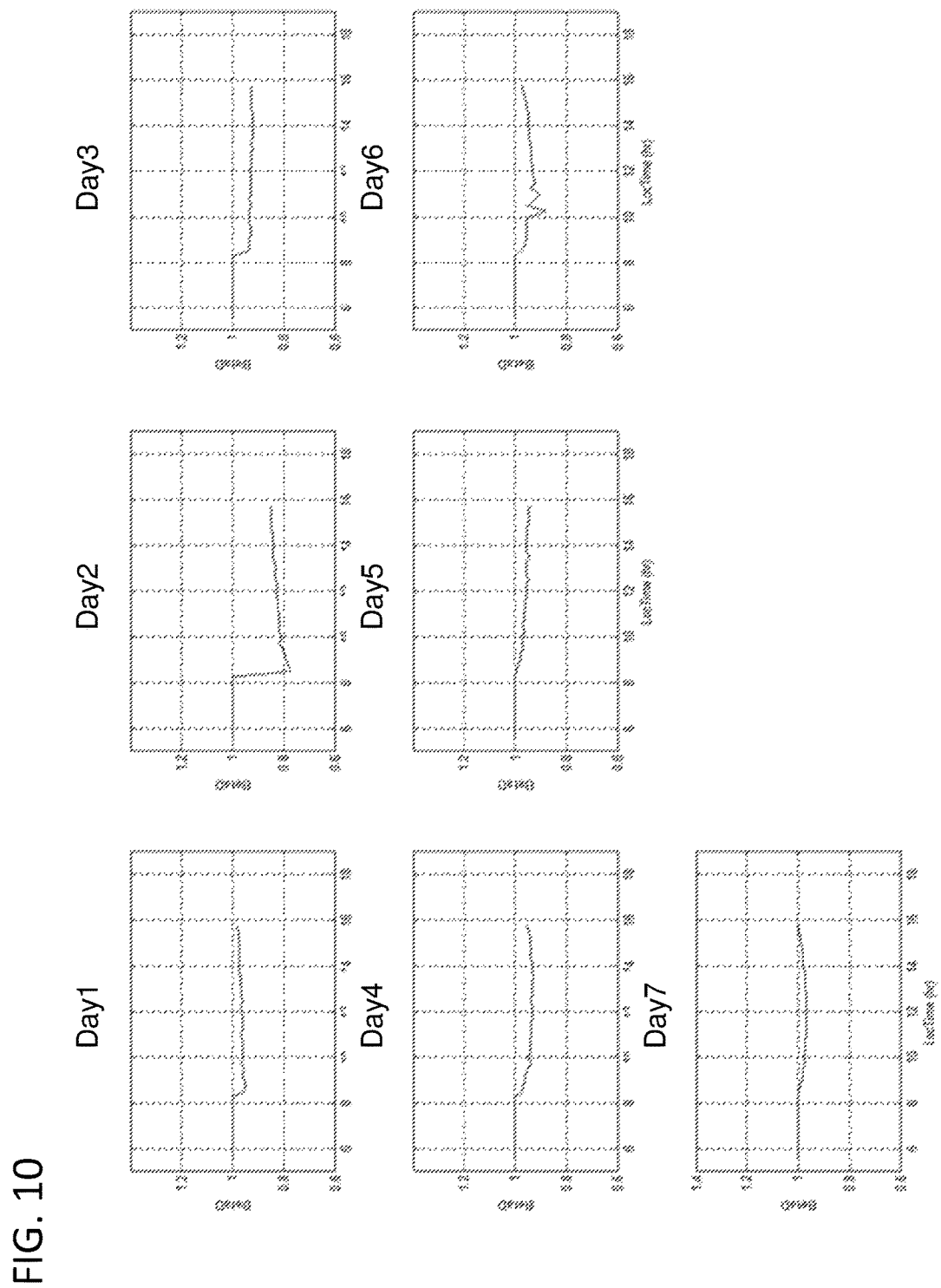
FIG. 10 is a series of schematic plots of dynamic correction factor for direct normal irradiance as a function of time, in accordance with embodiments of the present disclosure, over the course of a week.
Figure 11:
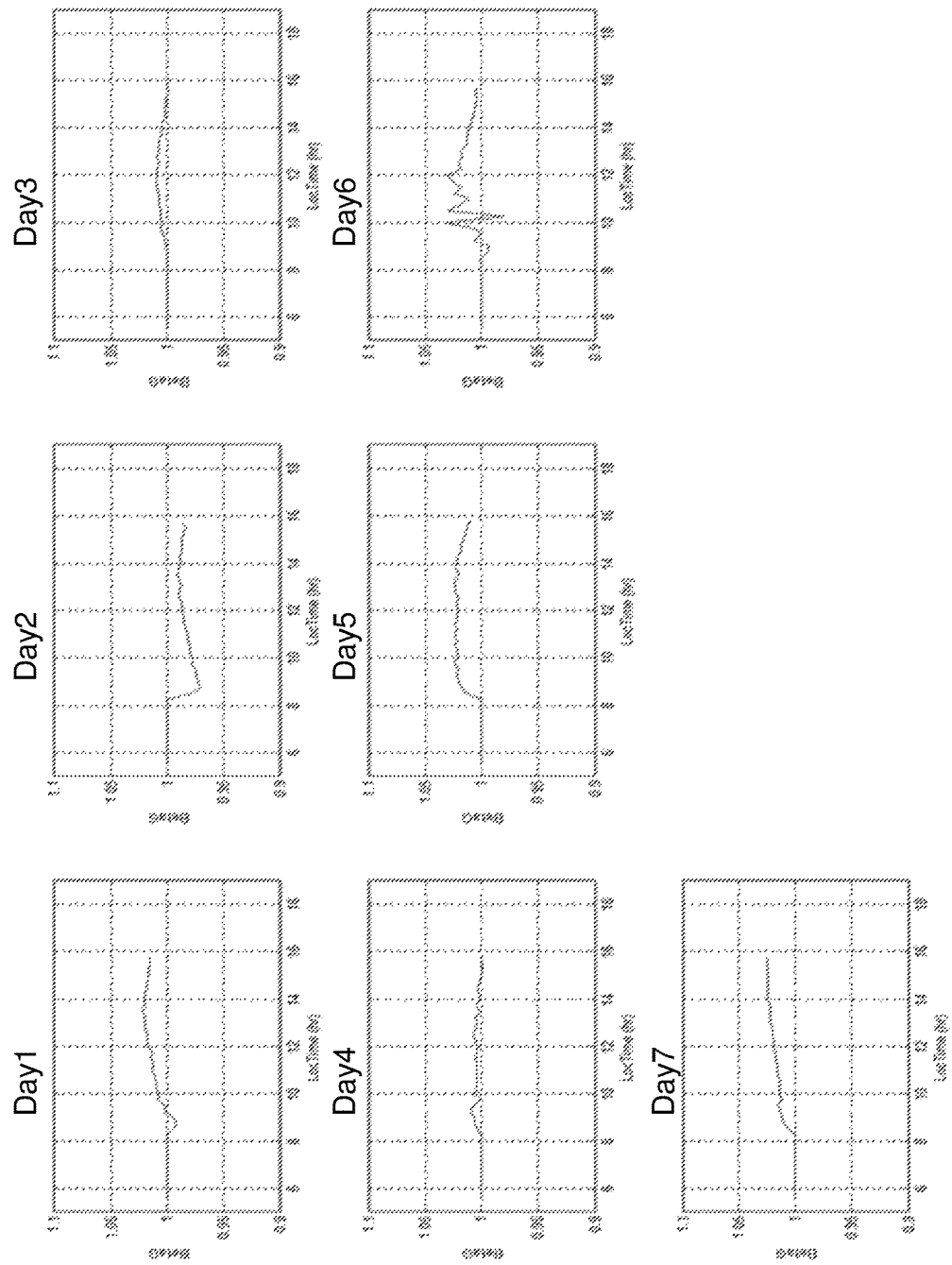
FIG. 11 is a series of schematic plots of dynamic correction factor for global horizontal irradiance as a function of time, in accordance with embodiments of the present disclosure, over the course of a week.

Turning now to FIGS. 10 and 11, values of the dynamic correction factor $\beta$ tracked over a period of a week are shown. FIG. 10 shows the dynamic correction factor $\beta$ for a DNI dynamic correction factor model and FIG. 11 shows the dynamic correction factor $\beta$ for a GHI dynamic correction factor model.

As shown, in both cases (DNI and GHI) the dynamic correction factor $\beta$ is not constant throughout the day. Analysis over several days on a given site shows that the trend for the dynamic correction factor $\beta$ can be increasing (e.g., FIG. 10: Days 1 & 2; FIG. 11: Day 7), decreasing (e.g., FIG. 10: Day 5; FIG. 11: Day 5), or mixed/variable (e.g., FIG. 10: Days 6 & 7; FIG. 11: Days 1, 2, 3, & 6). From FIGS. 10 and 11, those of skill in the art will appreciate that the time derivative of the dynamic correction factor β can be either positive, zero, or negative for parts of a day and. Further, with respect to FIG. 10, the magnitude of the dynamic correction factor β for DNI is less than one in all instances. This indicates that the fixed correction factor model for DNI, at least, always over predicts the DNI value for a given time, and thus the model provides values that estimate too high of a power for a given time.

Similarly, FIG. 11 shows that the magnitude of the dynamic correction factor β for GHI is mostly greater than one (except for Day-2) indicating that the fixed correction factor model for GHI generally under predicts the power for a given time.

As will be appreciated by those of skill in the art, the dynamic correction factor models, as provided, herein, enable an improved power estimation for a given time period based on prior data, thus updating and changing a correction factor through a day.

Further, the time dependence of the dynamic correction factor β can generate additional insights for solar analytics research. For example, a magnitude of the dynamic correction factor β may be used as a proxy variable or a "sensor" for complex atmospheric phenomena. For example, a GHI the dynamic correction factor β greater than one may indicate that more energy is received that anticipated by a fixed correction factor model.

Figure 12:
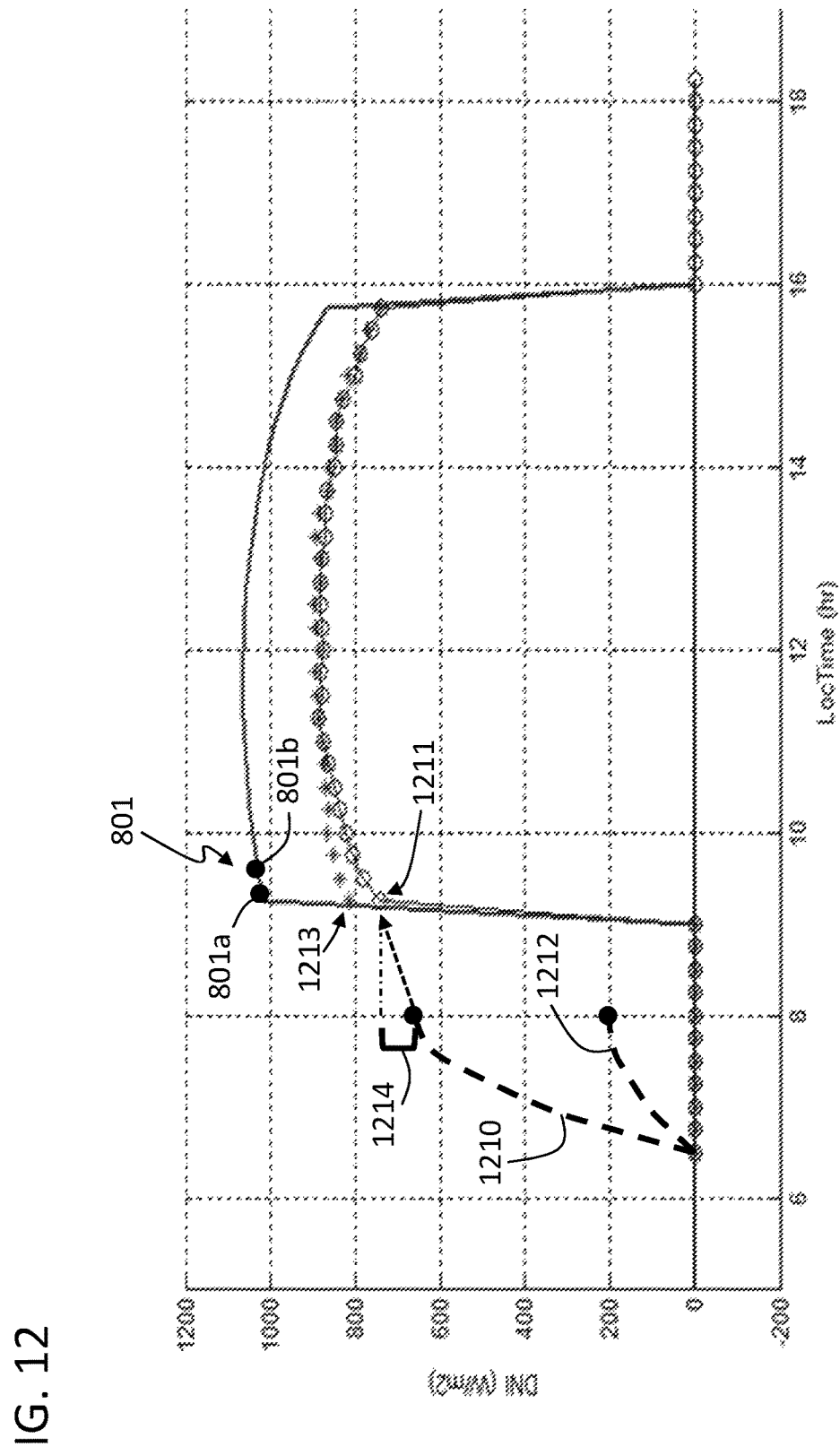
FIG. 12 is a schematic plot of modeling and measured values in accordance with an embodiment of the present disclosure, providing improved early-start considerations.

Turning now to FIG. 12, an additional feature of embodiments as provided herein is shown. As is evident from FIGS. 6-7, a start-up transient of the estimator can introduce error. For example, as shown, the first two predicted power values 801, in FIG. 8, are higher than the measured power values for the same time (line 802). This may be caused by an omission of "early hour" data due to uncertainty in cloud conditions during the early hours. However, further logic can be used to activate the start-up process earlier, and thus account for and be more accurate earlier in a given day. The "early hour" data may be omitted because data from satellites may not be valid when the sun is low on the horizon. Accordingly, the information may be supplemented with measurements and/or sensor data that are ground-based, rather than satellite based.

For example, the data shown in FIG. 12, the first two predicted power values 801 are shown at 9:00 am (801a) and 9:15 am (801b). After this, as shown, dynamic correction factor β is adjusted, as described above, to achieve predicted values that are closer to the ground based measurement (see, e.g., FIG. 8A). Under a large start-up transient such as this case, it may take about one and a half hours for the estimator to bring the forecast closer to the measurement. However, embodiments provided herein may compensate and/or account for this discrepancy, and thus provide improved start-up estimations of power.

As will be appreciated by those of skill in the art, before 8:00 am (in FIG. 12), it is not known a priori whether it is truly sunny or cloudy based on satellite data along. However, ground-based sensors may start operating and collecting data reliably as early as 6:30 am. For example, ground-based measured data and a related estimation on a sunny day is indicated as dashed line 1210 and ground-based measured data and a related estimation on a cloudy day is indicated as dashed line 1212.

Thus, in accordance with an embodiment of the present disclosure, at 6:30 am, two independent estimator threads may be started. The first one assumes a sunny day and it adjusts the sunny-day model to track the measured ground sensors (e.g., line 1210). The second model assumes a cloudy day with much lower solar irradiance and tries to adjust itself to the measured data (e.g., 1212). At 8:00 am, both estimator outputs may be examined (i.e., when satellite data may be introduced). The system may compare the modeled data to the measured data, and determine which model is the better fit (i.e., a selection between a model of line 1210 and a model of line 1212).

The correct choice between the two early-start models will have a smaller adjustment to make (i.e., difference from the measurements as indicated at difference 1214) and will be able to track closer to the measurements/actual power data. As a result, the early-start model is closer to the measurement at 8:00 am and this model is the better option of the two. The dynamic correction factor β's for GHI and DNI corresponding to the selected early-start model may be transferred to the main model for the day and the new forecast may be more accurate earlier in the day. For example, as shown in FIG. 12, the main model is about 750 W/m$^2$ at first prediction point 1211, which is much closer to the measurement at the same time (measurement point 1213, shown as an asterisk). In contrast, first estimated point 801a from a model not accounting for early start is shown as forecasting about 1050 W/m$^2$. Thus, by accounting for the early start error, embodiments provided herein may enable an improved power estimation model.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A computer implemented method to estimate future levels of solar power received at a sensor, the method comprising:

receiving, by a processor, a first measured power value at a first time from the sensor, wherein the first measured power is measured with a sensor configured to measure a power received from the sun;

calculating, by the processor, a first value of a dynamic correction factor based on the first measured power value associated with the first time, wherein the dynamic correction factor $\beta$ is represented as $\beta(n)=\beta(n-1)+T*w(n)$, wherein T is a measurement sampling time, wherein w(n) is a value of a random variable at instance n, wherein n is an instance at time t, wherein the first value of the dynamic correction factor is calculated by at least $\beta(n^-)=\beta[(n-1)^+]$, wherein $\beta(n^-)$ is the first value of the dynamic correction factor associated with the first time, wherein n is the first time, wherein the dynamic correction factor is equal to one at a time prior to the first time;

applying, by the processor, the first value of the calculated dynamic correction factor to a power estimation model;

generating, by the processor, a first power estimation value for the first time using the power estimation model;

receiving, by the processor a second measured power value at a second time, wherein the second time is later than the first time;

updating, by the processor, the dynamic correction factor by at least calculating a second value of a dynamic correction factor based on the second measured power value associated with the second time and the first value of the dynamic correction factor, wherein the second value of the dynamic correction factor $\beta$ is calculated by at least $\beta(n^+)=\beta(n^-)+L*[P_m(n)-P_e(n^-)]$, wherein $\beta(n^+)$ is the second value of the dynamic correction factor associated with the second time, wherein $P_m(n)$ is the second measured power, wherein $P_e(n^-)$ is the first power estimate value, wherein n is the second time, wherein $n^+$ is a third time that is later than the second time, and wherein L is an estimator gain constant; and controlling, by the processor, power output of at least one of a solar power plant or a solar generator based in part on a second power estimation value that is generated for the third time using the power estimation model, wherein the second power estimation value is generated by a least calculating, by the processor, $P_e(n^+)=\beta(n^+)P_{model}(n)$, wherein $P_{model}(n)$ is the first power estimation value.

2. The computer implemented method of claim 1, wherein the power estimation model is used to estimate direct normal irradiance.

3. The computer implemented method of claim 1, wherein the power estimation model is used to estimate global horizontal irradiance.

4. The computer implemented method of claim 1, wherein the calculation of the dynamic correction factor is a random-walk estimation process.

5. The computer implemented method of claim 4, wherein the random-walk estimation process comprises a random-ramp estimation process.

6. The computer implemented method of claim 1, further comprising, prior to receiving the first measured power, using a first early-start model and a second early-start model to estimate an early-start value for the dynamic correction factor.

7. A system to estimate future levels of solar power received at a sensor comprising:

a memory having computer readable instructions; and a processor configured to execute the computer readable instructions, the computer readable instructions comprising:

receiving, by the processor, a first measured power value at a first time from the sensor, wherein the first measured power is measured with a sensor configured to measure a power received from the sun;

calculating, by the processor, a first value of a dynamic correction factor based on the first measured power value associated with the first time, wherein the dynamic correction factor $\beta$ is represented as $\beta(n)=\beta(n-1)+T*w(n)$, wherein T is a measurement sampling time, wherein w(n) is a value of a random variable at instance n, wherein n is an instance at time t, wherein the first value of the dynamic correction factor is calculated by at least $\beta(n^-)=\beta[(n-1)^+]$, wherein $\beta(n^-)$ is the first value of the dynamic correction factor associated with the first time, wherein $n^-$ is the first time, wherein the dynamic correction factor is equal to one at a time prior to the first time;

applying, by the processor, the first value of the calculated dynamic correction factor to a power estimation model;

generating, by the processor, a first power estimation value for the first time using the power estimation model;

receiving, by the processor, a second measured power value at a second time, wherein the second time is later than the first time;

updating, by the processor, the dynamic correction factor by at least by at least calculating a second value of a dynamic correction factor based on the second measured power value associated with the second time and the first value of the dynamic correction factor, wherein the second value of the dynamic correction factor $\beta$ is calculated by at least $\beta(n^+)=\beta(n^-)+L*[P_m(n)-(n^-)]$, wherein $\beta(n^+)$ is the second value of the dynamic correction factor associated with the second time, wherein $P_m(n)$ is the second measured power, wherein $P_e(n^-)$ is the first power estimate value, wherein n is the second time, wherein $n^+$ is a third time that is later than the second time, and wherein L is an estimator gain constant; and controlling, by the processor, power output of at least one of a solar power plant or a solar generator based in part on a second power estimation value that is generated for the third time using the power estimation model, wherein the second power estimation value is generated by at least calculating, by the processor, $P_e(n^+)=\beta(n^+)P_{model}(n)$, wherein $P_{model}(n)$ is the first power estimation value.

8. The system of claim 7, wherein the power estimation model is used to estimate direct normal irradiance.

9. The system of claim 7, wherein the power estimation model is used to estimate global horizontal irradiance.

10. The system of claim 7, wherein the calculation of the dynamic correction factor is a random-walk estimation process.

11. The system of claim 10, wherein the random-walk estimation process comprises a random-ramp estimation process.

12. The system of claim 7, further comprising, prior to receiving the first measured power, using a first early-start model and a second early-start model to estimate an early-start value for the dynamic correction factor.

13. A computer program product to estimate future levels of solar power received at a sensor, the computer program product comprising a computer readable storage medium having program instructions embodied therewith, the program instructions executable by a processor to cause the processor to:
- receive, by the processor, a first measured power value at a first time from the sensor, wherein the first measured power is measured with a sensor configured to measure a power received from the sun;
- calculate, by the processor, a first value of a dynamic correction factor based on the first measured power value associated with the first time, wherein the dynamic correction factor $\beta$ is represented as $\beta(n)=\beta(n-1)+T*w(n)$, wherein T is a measurement sampling time, wherein w(n) is a value of a random variable at instance n, wherein n is an instance at time t, wherein the first value of the dynamic correction factor is calculated by at least $\beta(n^-)=\beta[(n-1)^+]$, wherein $\beta(n^-)$ is the first value of the dynamic correction factor associated with the first time, wherein $n^-$ is the first time, wherein the dynamic correction factor is equal to one at a time prior to the first time;
- apply, by the processor, the first value of the calculated dynamic correction factor to a power estimation model;
- generate, by the processor, a first power estimation value for the first time using the power estimation model;
- receive, by the processor, a second measured power value at a second time wherein the second time is later than the first time;
- update, by the processor, the dynamic correction factor by at least calculating a second value of a dynamic correction factor based on the second measured power value associated with the second time and the first value of the dynamic correction factor, wherein the second value of the dynamic correction factor $\beta$ is calculated by at least $\beta(n^+)=\beta(n^-)+L*[P_m(n)-P_e(n^-)]$, wherein $\beta(n^+)$ is the second value of the dynamic correction factor associated with the second time, wherein $P_m(n)$ is the second measured power, wherein $P_e(n^-)$ is the first power estimate value, wherein n is the second time, wherein $n^+$ is a third time that is later than the second time, and wherein L is an estimator gain constant; and
- controlling, by the processor, power output of at least one of a solar power plant or a solar generator based in part on a second power estimation value that is generated for the third time using the power estimation model, wherein the second power estimation value is generated by at least calculating, by the processor, $P_e(n^+)=\beta(n^+) P_{model}(n)$, wherein $P_{model}(n)$ is the first power estimation value.

14. The computer program product of claim 13, wherein the power estimation model is used to estimate direct normal irradiance.

15. The computer program product of claim 13, wherein the power estimation model is used to estimate global horizontal irradiance.

16. The computer program product of claim 13, wherein the calculation of the dynamic correction factor is a random-walk estimation process.

17. The computer program product of claim 16, wherein the random-walk estimation process comprises a random-ramp estimation process.

18. The computer program product of claim 13, wherein the program instructions executable by the processor further cause the processor to calculate a second power estimation value for the third time using the power estimation model and the second value of the dynamic correction factor, wherein the second power estimation value is calculated by $P_e(n^+)=\beta(n^+)P_{model}(n)$, wherein $P_{model}(n)$ is the first power estimation value.

19. The computer program product of claim 13, further comprising, prior to receiving the first measured power, using a first early-start model and a second early-start model to estimate an early-start value for the dynamic correction factor.

* * * * *